US010680427B2

(12) United States Patent
Emrani et al.

(10) Patent No.: US 10,680,427 B2
(45) Date of Patent: Jun. 9, 2020

(54) HURST EXPONENT BASED ADAPTIVE DETECTION OF DC ARC FAULTS IN A VEHICLE HIGH VOLTAGE SYSTEM

(71) Applicants: Ford Global Technologies, LLC, Dearborn, MI (US); Ohio State Innovation Foundation, Columbus, OH (US)

(72) Inventors: Amin Emrani, Ann Arbor, MI (US); Jin Wang, Powell, OH (US); Zhuo Wei, Columbus, OH (US); Boxue Hu, Columbus, OH (US); Yafeng Wang, Charlotte, NC (US); Yousef Abdullah, Columbus, OH (US)

(73) Assignee: Ford Global Technologies, LLC, Dearborn, MI (US)

( * ) Notice: Subject to any disclaimer, the term of this patent is extended or adjusted under 35 U.S.C. 154(b) by 468 days.

(21) Appl. No.: 15/686,895

(22) Filed: Aug. 25, 2017

(65) Prior Publication Data

US 2019/0067927 A1 Feb. 28, 2019

(51) Int. Cl.
*H02H 1/00* (2006.01)
*G01R 31/12* (2020.01)
*G01R 31/00* (2006.01)
*B60L 3/00* (2019.01)
*G06F 1/28* (2006.01)
*H02H 7/20* (2006.01)

(52) U.S. Cl.
CPC ......... *H02H 1/0092* (2013.01); *B60L 3/0046* (2013.01); *G01R 31/007* (2013.01); *G01R 31/1272* (2013.01); *G06F 1/28* (2013.01); *H02H 1/0015* (2013.01); *H02H 7/20* (2013.01)

(58) Field of Classification Search
CPC ...... H02H 1/0092; H02H 1/0015; H02H 7/20; G01R 31/1272; G01R 31/007; G01R 31/12; B60L 3/0046; G06F 1/28
USPC ........................................................ 361/101
See application file for complete search history.

(56) References Cited

U.S. PATENT DOCUMENTS

| | | |
|---|---|---|
| 5,659,453 A | 8/1997 | Russel et al. |
| 6,683,766 B1 | 1/2004 | Guo |
| 7,187,181 B2 | 3/2007 | Parker |
| 7,400,481 B2 | 7/2008 | Pellon et al. |
| 7,403,129 B2 | 7/2008 | Zhou |
| 7,782,578 B2 | 8/2010 | Tao |
| 7,840,396 B2 | 11/2010 | Radibratovic |
| 7,952,843 B2 | 5/2011 | Potter |
| 9,111,057 B2 | 8/2015 | Radibratovic et al. |
| 9,713,431 B2 * | 7/2017 | Brockway .............. A61B 5/046 |
| 2002/0118022 A1 | 8/2002 | Dring et al. |
| 2002/0183944 A1 | 12/2002 | Dollar |

(Continued)

*Primary Examiner* — Dharti H Patel
(74) *Attorney, Agent, or Firm* — Frank Lollo; Eversheds Sutherland (US) LLP

(57) ABSTRACT

Systems devices and methods are disclosed for detecting DC arc faults in a high voltage vehicle electrical distribution system. An example vehicle includes a high voltage electronic system comprising a current sensor configured to capture current data and a processor. The processor is configured to generate filtered data by applying a filter to the current data, determine a Hurst exponent based on the filtered data, and responsive to determining a threshold change in the Hurst exponent, detect the presence of a DC arc in the high voltage electronic system.

16 Claims, 6 Drawing Sheets

(56) References Cited

U.S. PATENT DOCUMENTS

| | | | |
|---|---|---|---|
| 2004/0027749 A1* | 2/2004 | Zuercher | H02H 1/0015 |
| | | | 361/62 |
| 2010/0148791 A1 | 6/2010 | Oldenburg | |
| 2016/0011249 A1 | 1/2016 | Miller, III et al. | |
| 2017/0258342 A1* | 9/2017 | Ukil | A61B 5/7221 |
| 2017/0331232 A1* | 11/2017 | White | H02H 3/18 |

* cited by examiner

US 10,680,427 B2

HURST EXPONENT BASED ADAPTIVE DETECTION OF DC ARC FAULTS IN A VEHICLE HIGH VOLTAGE SYSTEM

TECHNICAL FIELD

The present disclosure generally relates to high voltage electronic systems in vehicles and, more specifically, detecting a DC arc fault in a high voltage vehicle electronic system.

BACKGROUND

Modern vehicles may include batteries and electrical distribution systems which may operate using various voltage and current levels, including high voltage systems (e.g., 48V and higher). The use of high voltages may increase a possibility of a sustainable arc between nodes of the system.

SUMMARY

The appended claims define this application. The present disclosure summarizes aspects of the embodiments and should not be used to limit the claims. Other implementations are contemplated in accordance with the techniques described herein, as will be apparent to one having ordinary skill in the art upon examination of the following drawings and detailed description, and these implementations are intended to be within the scope of this application.

Example embodiments are shown describing systems, apparatuses, and methods for detecting one or more direct current (DC) arc faults in a high voltage vehicle electrical distribution system. An example disclosed vehicle includes a high voltage electronic system comprising a current sensor configured to capture current data, and a processor. The processor is configured to generate filtered data by applying a filter to the current data, determine a Hurst exponent based on the filtered data, and responsive to determining a threshold change in the Hurst exponent, detect the presence of a DC arc in the high voltage electronic system.

An example disclosed method includes capturing current data using a current sensor of a high voltage vehicle electronic system. The method also includes generating filtered data by applying a filter to the current data. The method further includes determining a Hurst exponent based on the filtered data. And the method still further includes, responsive to determining a threshold change in the Hurst exponent, detecting the presence of a DC arc in the high voltage electronic system.

A third example may include means for capturing current data using a current sensor of a high voltage vehicle electronic system. The third example may also include means for generating filtered data by applying a filter to the current data. The third example may further include includes means for determining a Hurst exponent based on the filtered data, and means for, responsive to determining a threshold change in the Hurst exponent, detecting the presence of a DC arc in the high voltage electronic system.

BRIEF DESCRIPTION OF THE DRAWINGS

For a better understanding of the invention, reference may be made to embodiments shown in the following drawings. The components in the drawings are not necessarily to scale and related elements may be omitted, or in some instances proportions may have been exaggerated, so as to emphasize and clearly illustrate the novel features described herein. In addition, system components can be variously arranged, as known in the art. Further, in the drawings, like reference numerals designate corresponding parts throughout the several views.

DETAILED DESCRIPTION OF EXAMPLE EMBODIMENTS

Figure 1:
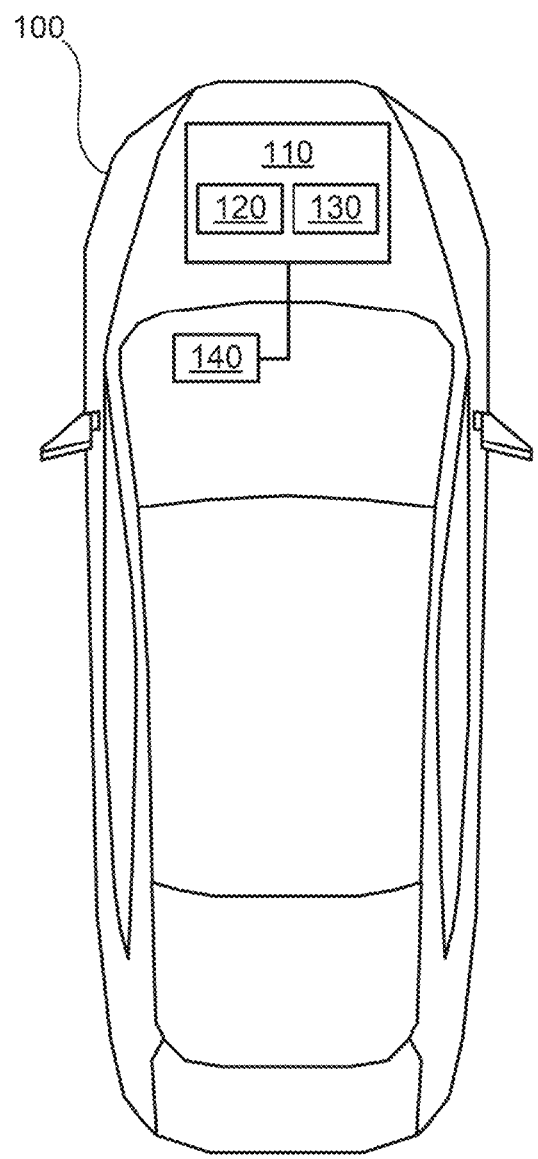
FIG. 1 illustrates an example vehicle according to embodiments of the present disclosure.

While the invention may be embodied in various forms, there are shown in the drawings, and will hereinafter be described, some exemplary and non-limiting embodiments, with the understanding that the present disclosure is to be considered an exemplification of the invention and is not intended to limit the invention to the specific embodiments illustrated.

As noted above, vehicles may include high voltage electrical distribution systems which may distribute power to various loads, systems, and subsystems of a vehicle. With the increased usage of high voltages, in particular with respect to hybrid and all-electric vehicles, the risk of arc faults have also increased. A sustained arc between two or more nodes of the electrical system can cause permanent damage to the systems and components. However the nature of high voltage systems may be such that protection mechanisms (e.g., fuses or other switches) may not be "tripped" quickly enough to prevent the damage, or may not be "tripped" at all where the current does not reach a threshold level. For instance, some electrical distribution systems may be configured to distribute large currents to various systems of the vehicle (e.g., the drive train, battery storage, etc.). As such, a fuse corresponding to this segment of the distribution system may have a high rating, and may not trip unless the current is very high. But one or more systems in series with this segment may be damaged by a current much lower than that required to trip the fuse. And a DC arc fault on this segment may cause a current draw smaller than that required to trip the fuse. As such, there is a need for systems and methods to detect and mitigate damage caused by DC arc faults in high voltage vehicle electronic systems.

Further, vehicle electronic systems in particular may be coupled to a plurality of loads and other power electronics, which may cause electronic switching noise. This switching noise may interfere with techniques designed to detect and mitigate damage caused by DC arc faults.

Examples disclosed herein may provide practical low cost arc detecting systems for 48V or higher vehicle electrical distribution systems. In some examples, a Hurst exponent method may be used to analyze and detect any abnormal behavior in the current including DC arcs. The Hurst exponent method may analyze the long term memory behavior of a signal, such as a current signal, and may differentiate between a signal that follows a random pattern and a signal that follows a trend. For instance, Hurst exponent values can be anywhere between zero and one. The value of the Hurst exponent can represent the predictability of the signal, such that a value of one indicated a persistent (or positively correlated) signal. A value of zero, on the other hand, can indicate an anti-persistent (or negatively correlated) signal. A purely random signal may have a Hurst exponent value of 0.5.

The sudden introduction of a DC arc into an electrical system with the current being monitored may change the value of a Hurst exponent calculated for the signal. However, this change may be difficult to detect, due to switching noise from, for example, power electronics in the electrical system. Other sources of noise may exist as well, in addition to false-flag sources which may act like a DC arc such as the addition or removal of one or more loads to the electrical system.

Example embodiments herein may include a high voltage electronic system comprising one or more current sensors configured to capture current data of the electronic system. A plurality of current sensors may be used to measure current passing through various segments of the electronic system. The vehicle may also include a processor which may be configured to generate filtered data by applying a filter to the captured current data. Then, based on the filtered data (both a current value and one or more historical values), the processor may determine a Hurst exponent. The value of the Hurst exponent may change over time as the current data changes. Where a threshold change in the Hurst exponent is determined, the processor may detect the presence of a DC arc in the high voltage electronic system.

FIG. 1 illustrates an example vehicle 100 according embodiments of the present disclosure. Vehicle 100 may be a standard gasoline powered vehicle, a hybrid vehicle, an electric vehicle, a fuel cell vehicle, or any other mobility implement type of vehicle. Vehicle 100 may be non-autonomous, semi-autonomous, or autonomous. Vehicle 100 includes parts related to mobility, such as a powertrain with an engine, a transmission, a suspension, a driveshaft, and/or wheels, etc. In the illustrated example, vehicle 100 may include one or more electronic components (described below with respect to FIG. 2).

As shown in FIG. 1, vehicle 100 may include a high voltage electrical system 110, one or more current sensors 120, a processor 130, and one or more electrical loads 140. Vehicle 100 may include one or more additional electronic components, described in further detail with respect to FIG. 2.

The high voltage electrical system 110 may include one or more batteries, alternators, motors, generators, or other power electronics components configured to generate, store, and transmit electricity. As noted above, some high voltage vehicle electronic systems may include voltages of 48V or more. In some examples, a fully electric vehicle may include voltages up to 300V. High voltage electrical system 110 may include one or more current sensors 120, configured to measure currents through various parts, components, branches, and systems of the system 110.

Processor 130 may be configured to carry out one or more features, functions, or actions described herein. In some examples, processor 130 may be a centralized processor, and may be configured to carry out many more functions than those described. In other examples, processor 130 may be specialized, and may be configured to carry out functions related to DC arc detection and mitigation only. Further, processor 130 may be a single unit, or may include multiple units. For instance, where multiple smart FETs or other fuses are included in high voltage electronic system 110, processor 130 may be distributed amongst the smart FETs, such that each smart FET includes a processor configured to carry out one or more functions described herein.

High voltage electronic system 110 may also include one or more electrical loads 140. Each load may correspond to a particular system or component, which may turn on and off based on control from processor 130 and/or one or more other systems or devices.

Figure 2:
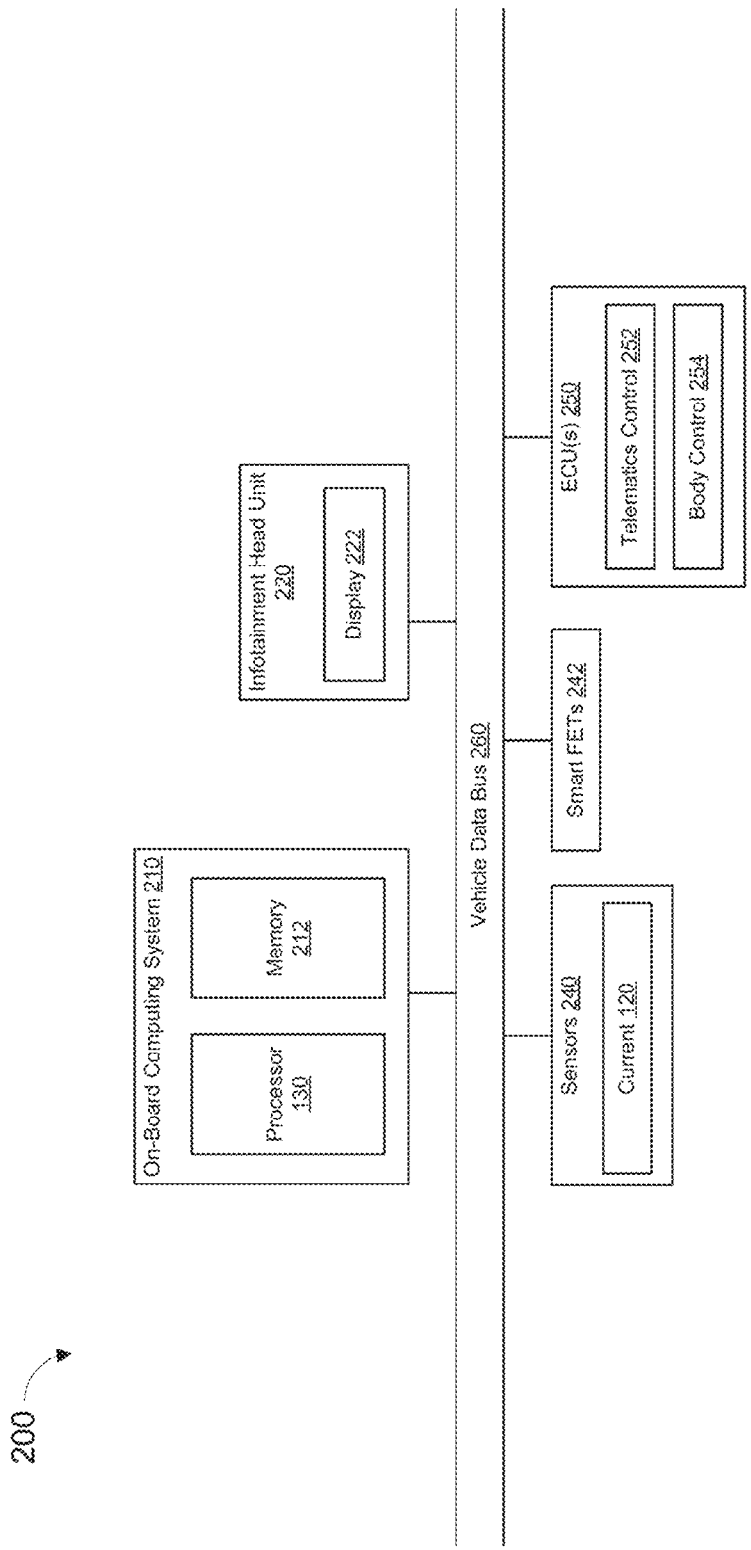
FIG. 2 illustrates an example block diagram of electronic components of the vehicle of FIG. 1.

FIG. 2 illustrates an example block diagram 200 showing electronic components of vehicle 100, according to some embodiments. In the illustrated example, the electronic components 200 include an on-board computing system 210, infotainment head unit 220, sensors 240, smart field effect transistors (FETs) 242, electronic control unit(s) 250, and vehicle data bus 260.

The on-board computing system 210 may include a microcontroller unit, controller or processor 130 and memory 212. Processor 130 may be any suitable processing device or set of processing devices such as, but not limited to, a microprocessor, a microcontroller-based platform, an integrated circuit, one or more field programmable gate arrays (FPGAs), and/or one or more application-specific integrated circuits (ASICs). The memory 212 may be volatile memory (e.g., RAM including non-volatile RAM, magnetic RAM, ferroelectric RAM, etc.), non-volatile memory (e.g., disk memory, FLASH memory, EPROMs, EEPROMs, memristor-based non-volatile solid-state memory, etc.), unalterable memory (e.g., EPROMs), read-only memory, and/or high-capacity storage devices (e.g., hard drives, solid state drives, etc). In some examples, the memory 212 includes multiple kinds of memory, particularly volatile memory and non-volatile memory.

The memory 212 may be computer readable media on which one or more sets of instructions, such as the software for operating the methods of the present disclosure, can be embedded. The instructions may embody one or more of the methods or logic as described herein. For example, the instructions reside completely, or at least partially, within any one or more of the memory 212, the computer readable medium, and/or within the processor 130 during execution of the instructions.

The terms "non-transitory computer-readable medium" and "computer-readable medium" include a single medium or multiple media, such as a centralized or distributed database, and/or associated caches and servers that store one or more sets of instructions. Further, the terms "non-transitory computer-readable medium" and "computer-readable medium" include any tangible medium that is capable of storing, encoding or carrying a set of instructions for execution by a processor or that cause a system to perform any one or more of the methods or operations disclosed herein. As used herein, the term "computer readable medium" is expressly defined to include any type of computer readable storage device and/or storage disk and to exclude propagating signals.

The infotainment head unit 220 may provide an interface between vehicle 100 and a user. The infotainment head unit 220 may include one or more input and/or output devices, such as display 222. The input devices may include, for example, a control knob, an instrument panel, a digital camera for image capture and/or visual command recognition, a touch screen, an audio input device (e.g., cabin microphone), buttons, or a touchpad. The output devices may include instrument cluster outputs (e.g., dials, lighting devices), actuators, a heads-up display, a center console display (e.g., a liquid crystal display (LCD), an organic light emitting diode (OLED) display, a flat panel display, a solid state display, etc.), and/or speakers. In the illustrated example, the infotainment head unit 220 includes hardware (e.g., a processor or controller, memory, storage, etc.) and software (e.g., an operating system, etc.) for an infotainment system (such as SYNC® and MyFord Touch® by Ford®, Entune® by Toyota®, IntelliLink® by GMC®, etc.). In some examples the infotainment head unit 220 may share a processor with on-board computing system 210. Additionally, the infotainment head unit 220 may display the infotainment system on, for example, a center console display 110 of vehicle 100.

Sensors 240 may be arranged in and around the vehicle 100 in any suitable fashion. In the illustrated example, sensors 240 include current sensor 120. Current sensor 120 may include one or more current sensors that detect, measure, or otherwise determine a current flowing through one or more segments or paths of the electrical systems of vehicle 100, such as high voltage electrical system 110. Other sensors may be included as well, such as voltage, resistance, load detection, and more.

Smart FETs 242 may be any type of power control device such as a mechanical fuse, electronic fuse (eFUSE), or relay. Systems and methods disclosed herein may make use of multiple smart FETs in order to connect or disconnect various systems, devices, and/or loads when a DC arc is detected. In some examples, the smart FETs may be distributed throughout the electrical system, such that each segment, system, load, or other element of the electrical system has a corresponding smart FET. Each smart FET may be coupled with a processor configured to carry out one or more functions or acts described herein, such that each smart FET can independently detect a DC arc and take appropriate action. Alternatively, each smart FET may be coupled to a central controller, which may activate or deactivate each smart FET individually.

The ECUs 250 may monitor and control subsystems of vehicle 100. ECUs 250 may communicate and exchange information via vehicle data bus 260. Additionally, ECUs 250 may communicate properties (such as, status of the ECU 250, sensor readings, control state, error and diagnostic codes, etc.) to and/or receive requests from other ECUs 250. Some vehicles 100 may have seventy or more ECUs 250 located in various locations around the vehicle 100 communicatively coupled by vehicle data bus 260. ECUs 250 may be discrete sets of electronics that include their own circuit(s) (such as integrated circuits, microprocessors, memory, storage, etc.) and firmware, sensors, actuators, and/or mounting hardware. In the illustrated example, ECUs 250 may include the telematics control unit 252 and the body control unit 254.

The telematics control unit 252 may control tracking of the vehicle 100, for example, using data received by a GPS receiver, communication module 230, and/or one or more sensors. The body control unit 254 may control various subsystems of the vehicle 100. For example, the body control unit 254 may control power a trunk latch, windows, power locks, power moon roof control, an immobilizer system, and/or power mirrors, etc. Other ECUs are possible as well.

Vehicle data bus 260 may include one or more data buses that communicatively couple the on-board computing system 210, infotainment head unit 220, sensors 240, smart FETs 242, ECUs 250, and other devices or systems connected to the vehicle data bus 260. In some examples, vehicle data bus 260 may be implemented in accordance with the controller area network (CAN) bus protocol as defined by International Standards Organization (ISO) 11898-1. Alternatively, in some examples, vehicle data bus 250 may be a Media Oriented Systems Transport (MOST) bus, or a CAN flexible data (CAN-FD) bus (ISO 11898-7).

Figure 3:
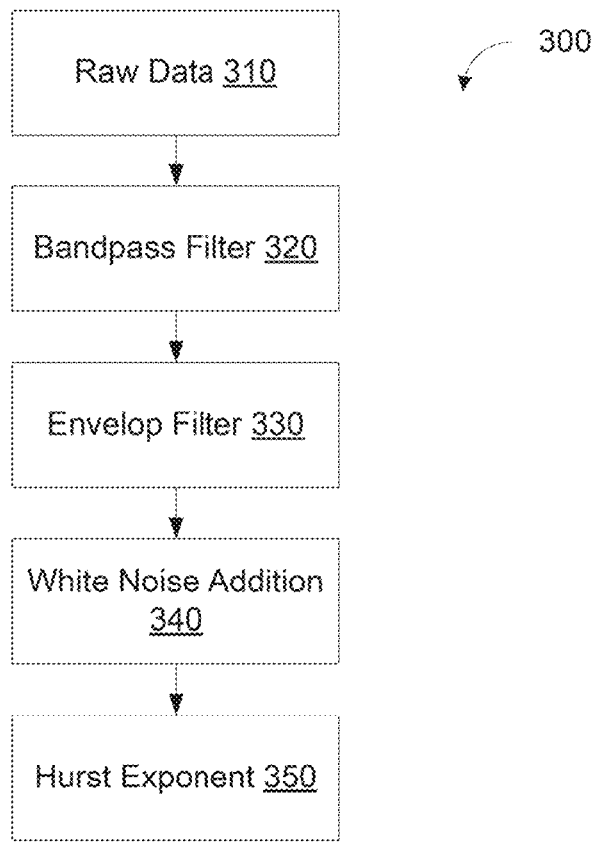
FIG. 3 illustrates a flowchart of an example method according to embodiments of the present disclosure.

FIG. 3 illustrates a simplified flowchart of an example method 300 according to embodiments of the present disclosure. Method 300 may enable a vehicle system to determine whether a DC arc has occurred that may cause damage to one or more components of any electronic systems of the vehicle. The flowchart of FIG. 3 (and FIG. 6, discussed below) is representative of machine readable instructions that are stored in memory (such as memory 212) and may include one or more programs which, when executed by a processor (such as processor 130) may cause vehicle 100 and/or one or more systems or devices to carry out one or more functions described herein. While the example program is described with reference to the flowchart illustrated in FIG. 3 (and FIG. 6), many other methods for carrying out the functions described herein may alternatively be used. For example, the order of execution of the blocks may be rearranged or performed in series or parallel with each other, blocks may be changed, eliminated, and/or combined to perform the disclosed methods. Further, because method 300 (and 600) is disclosed in connection with the components of FIGS. 1-2 and 4-5, some functions of those components will not be described in detail below.

Figure 4A:
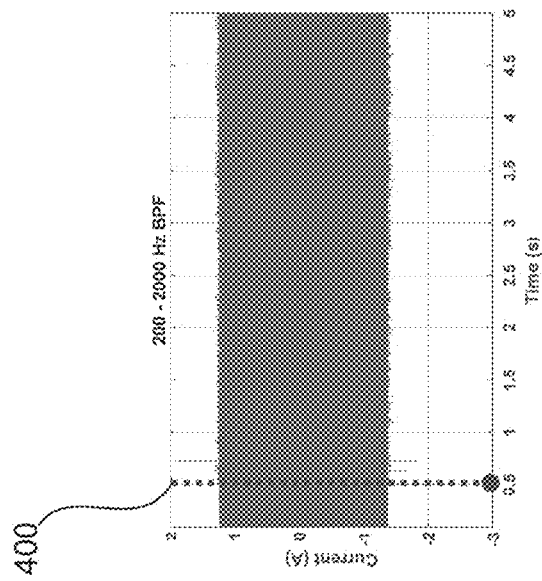
FIGS. 4A-D illustrate a series of four data graphs including a DC arc fault according to an embodiment of the present disclosure.

Method 300 may start at block 310, in which raw data is gathered. The raw data may be collected by one or more current sensors of the electronic system. FIG. 4A illustrates an example current signal vs. time. Point 400 corresponds to a time at which a DC arc occurs in this example. As can be seen in FIG. 4A, the raw current signal can be quite noisy, due to switching noise, background noise, and more sources of noise which may obscure the detection of a DC arc. FIG. 4A shows a DC arc occurring at point 400 along with a large amount of with switching noise. The waveform consists of an average current of 8 A and two switching frequencies: 500 Hz, 1000 Hz. The switching frequencies have 10% and 25% of the DC value of the signal respectively. Although this waveform is very noisy, embodiments herein accurately differentiate between the switching noise and the arc noise.

Figure 4B:
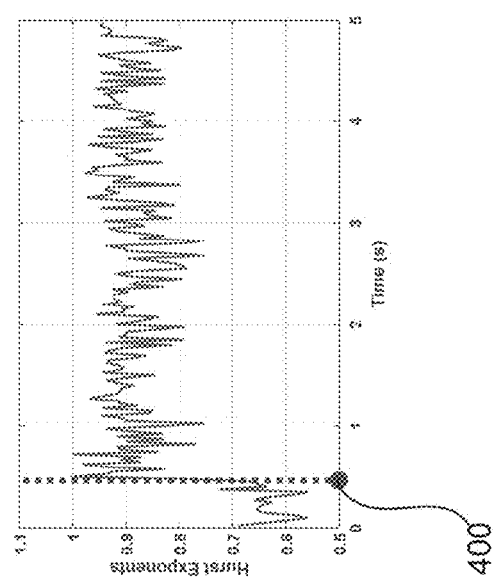

At block 320, method 300 may include applying a bandpass filter. The bandpass filter may remove the DC component of the current signal, as well as a low frequency range. FIG. 4B illustrates the current signal of FIG. 4A after the bandpass filter has been applied. The bandpass filter used here is limited to between 200 and 2000 Hz. However it should be noted that other ranges can be used as well.

Method 300 may further include applying an envelope filter at block 330. The envelope filter may remove any switching noise and other periodic signals from the current signal. The switching noise may be due to one or more loads switching on and off with a particular frequency, which was not removed by the bandpass filter.

The current signal envelope may be a curve which outlines the main signal extremes. By applying the envelope to the electrical current signal, switching noise may be removed from the waveform leaving only the noise signature generated by the DC arc. The envelope mainly affects switching noise and/or sinusoidal signals which may exist in the current waveform. Such signals may be generated by power electronics circuits (switching noise) or electric machines running in the vehicle. Periodic signals, which may have a known trend or known pattern, can affect the results of the Hurst exponent method. As such, the envelope may filter out these signals in order to improve the Hurst exponent method accuracy.

Figure 4C:
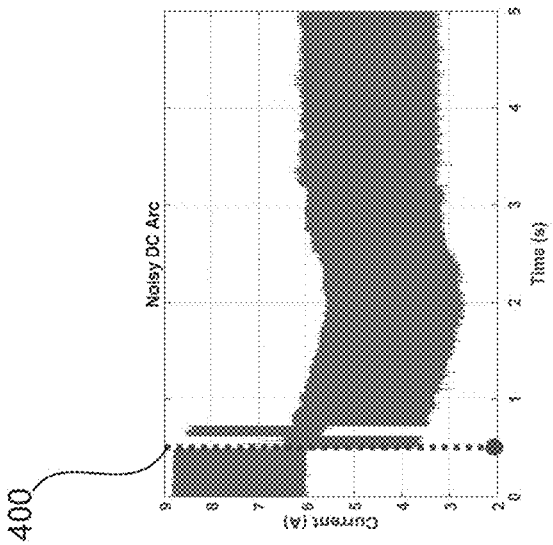

FIG. 4C illustrates the current signal envelope of the current signal from FIGS. 4A and 4B after the envelope filter has been applied.

At block 340, method 300 may include adding white noise. The white noise may assist in the later step of determining the Hurst exponent.

Figure 4D:
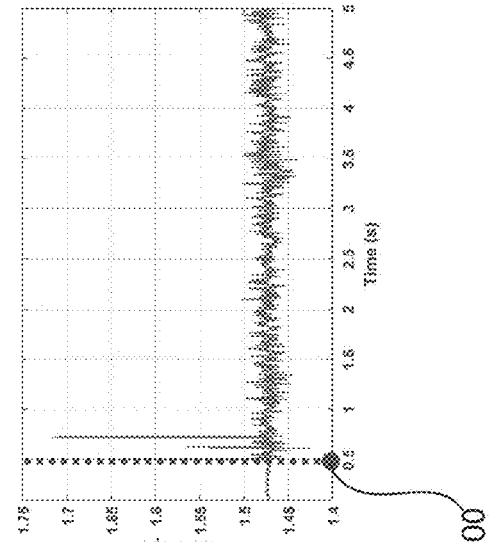

At block 350, method 300 may include determining the Hurst exponent of the filtered current signal. As noted above, the Hurst exponent value may correspond to a predictability of the signal. As such, a sudden persistent change in the predictability of a signal may indicate that a DC arc has occurred. FIG. 4D illustrates a plot showing the calculated Hurst exponent over time. In particular, the Hurst exponent may be calculated for a short time interval (e.g., 2 or more samples) or for a larger numbers of samples.

As can be seen in FIG. 4D, the Hurst exponent value changes quite dramatically at point 400, when the DC arc is introduced. This change represents a change in the Hurst exponent greater than a threshold change. The threshold may be a percentage value or an absolute value, and may be tied to or depend on one or more other calculations or factors. The systems, devices, and/or methods disclosed herein may be able to determine when a threshold change in the Hurst exponent has occurred.

In some examples, the threshold change may be determined based on an averaged Hurst exponent. This may include taking a rolling average or other average of the Hurst exponent over time. In other examples the threshold change may be determined based on a threshold change in value of the Hurst exponent for a threshold period of time.

Figure 5A:
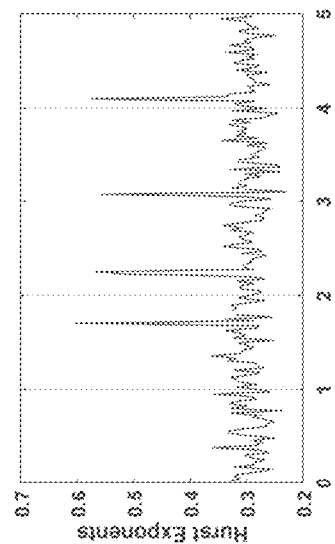
FIGS. 5A-D illustrate a series of four data graphs showing load changes according to an embodiment of the present disclosure.
Figure 5C:
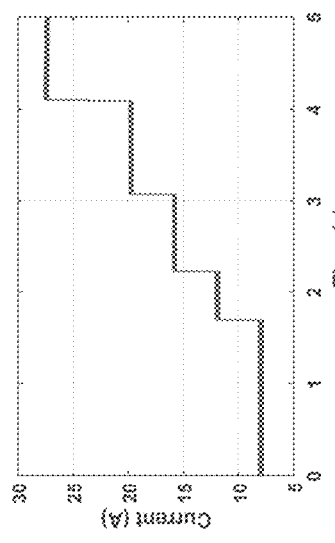
Figure 5B:
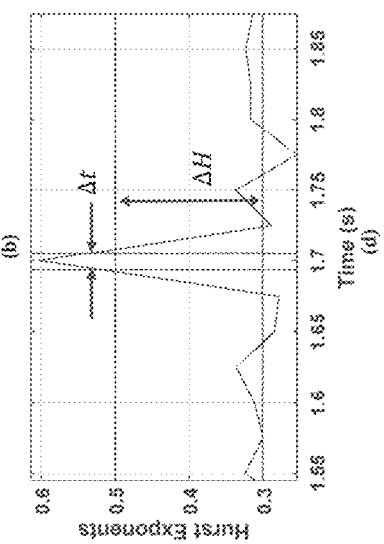
Figure 5D:
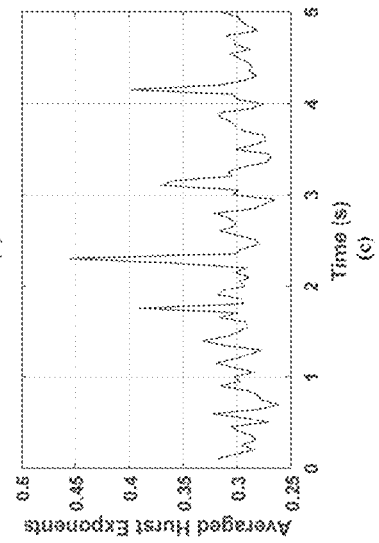

FIGS. 5A-D illustrate a scenario in which 4 additional loads are added to an electronic system, while no DC arc is present. FIG. 5A illustrates the current signal vs. time, FIG. 5B illustrates the Hurst exponent values (determined, for example, through the process described with respect to FIGS. 3 and 4A-D), FIG. 5C illustrates a rolling average of the Hurst Exponent, and FIG. 5D illustrates a time-based determination of the Hurst Exponent.

Hurst exponents values may change as any unexpected behavior occurs in the system. Load changes may also affect the Hurst exponent results and may cause a false alarm or false DC arc detection. Loads with low frequency transients may not miss-trigger a DC arc detection because a high pass filter can be applied to remove low frequency components. However, loads with high frequency transients, such as sudden load changes, can be seen as abnormal behavior and can cause a sudden change in the Hurst exponents values. To distinguish between a DC arc and a mere sudden load change, example embodiment may employ two techniques: averaged Hurst exponents, and time based detection.

For averaged Hurst exponents, a sudden load change may cause a spike in the Hurst exponent values for a very short time. To mitigate this problem, adjacent exponent values in time may be averaged to suppress the spike and avoid miss-triggering a DC arc detection.

For time based detection, load changes and arcs may be distinguished by measuring the time during which the change in Hurst exponents exceed a certain threshold, for instance by setting a threshold of 50 ms or more over which the Hurst exponent must be greater than the threshold magnitude to trigger a DC arc detection. FIG. 5D illustrates this threshold magnitude as $\Delta H$ while the threshold time period is labeled as $\Delta t$.

FIGS. 5A-D illustrate a scenario in which loads are added to the system to increase the current with steps from 8 A to 27 A. The data is processed and the corresponding Hurst exponents are plotted in FIG. 5B. The Hurst values momentarily change from around 0.3 to around 0.6 during the load transitions, indicating an abnormality in the signal. By using the first approach and averaging the Hurst exponents as shown in FIG. 5C, the spikes are suppressed down to 0.45 decreasing the amount of change in the Hurst exponent values.

The two techniques described above may be used to exclude a change in load as the cause of a change to the Hurst exponent. Alternatively or in addition, further analysis may be performed to exclude a change in load as the source of the change in a Hurst exponent. For instance, a table or database may be kept indicating whether one or more loads of the system are on or off. If there has been no change in the makeup of the connected loads and whether they are on or off, a load change may be ruled out.

Figure 6:
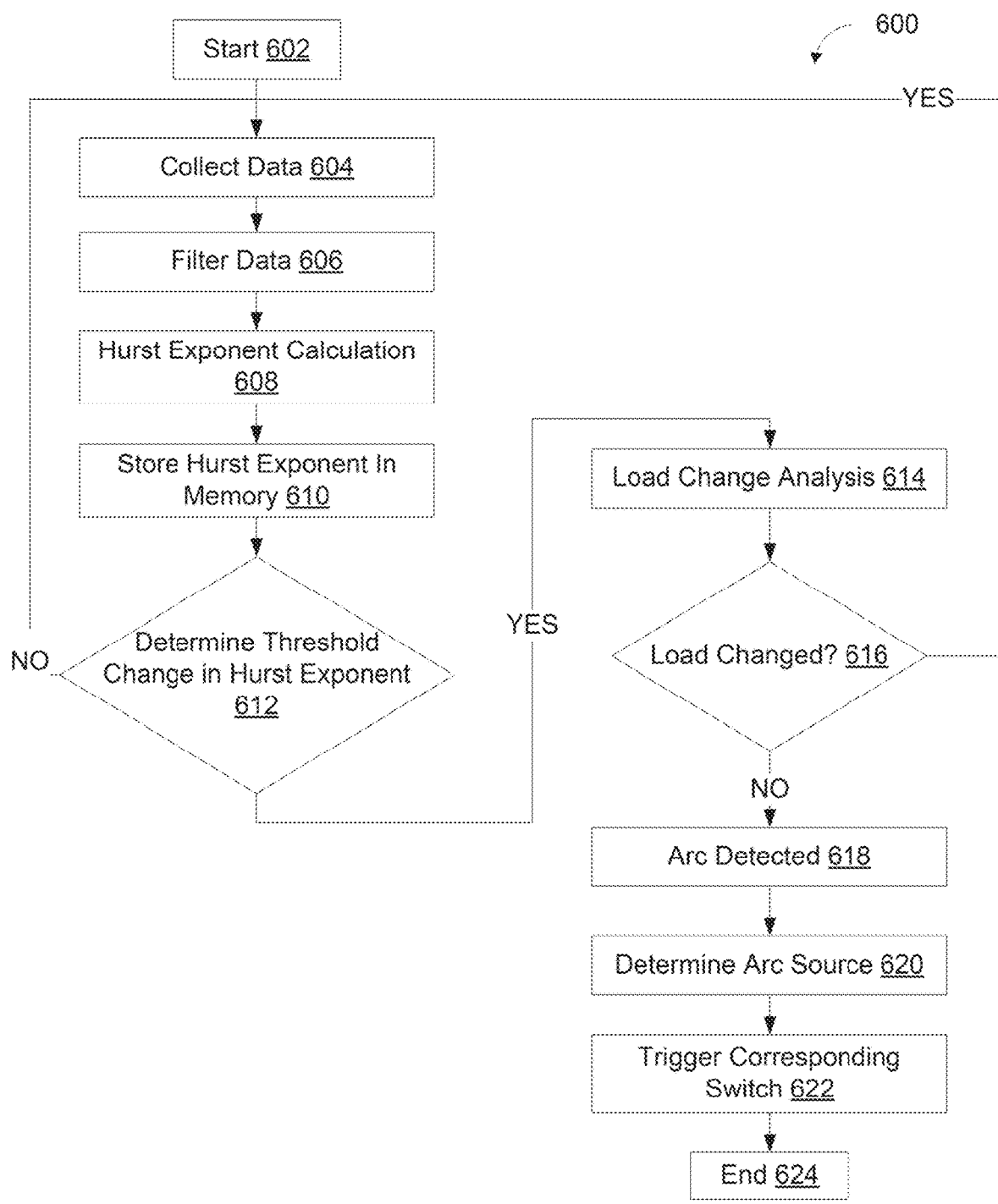
FIG. 6 illustrates a flowchart of an example method according to embodiments of the present disclosure.

FIG. 6 illustrates a flowchart of an example method 600 according to embodiments of the present disclosure. Method 600 may enable a vehicle system to determine whether a DC arc has occurred that may cause damage to one or more components of an electronic system of the vehicle.

Method 600 may start at block 602. At block 604, method 600 may include collecting data. The data may be collected by one or more current sensors, and may correspond to current values flowing through various parts, segments, or components of the vehicle electronics system.

At block 606, method 600 may include applying one or more filters to the collected data. This may include using a bandpass filter, an envelope filter, or more. At block 608, method 600 may include determining a Hurst exponent based on the filtered data.

At block 610, the Hurst exponent information may be stored in a memory. The storage of Hurst exponents over time may enable the method to more accurately determine whether a change in the Hurst exponent is due to a DC arc, switching noise from changes in loads, or from some other cause.

At block 612, method 600 may include determining whether a threshold change in the Hurst exponent has occurred. As described above, the threshold change can be determined based on a rolling average, or based on a threshold change in the Hurst exponent for a threshold period of time. If no threshold change has occurred, method 600 may revert back to block 604 for further data collection.

But if a threshold change is determined at block 612, method 600 may include performing a load change analysis at block 614. The load change analysis may include receiving or retrieving data regarding one or more loads that are currently connected or disconnected from the electronic system, on, off, or in another state with respect to the electrical system. This information may enable the method to determine that a change in load is not the cause of the threshold change in the Hurst exponent.

At block 616, method 600 may include determining whether a load has changed. If a load has changed and is determined to be the cause of the threshold change in the Hurst exponent, method 600 may revert back to block 604 for further data collection.

But if a change in load is not detected, or is excluded as the cause of the threshold change in the Hurst exponent, method 600 may include detecting that a DC arc has occurred.

Block 620 of method 600 may include determining the source of the DC arc. Where multiple current sensors are used, block 620 may include determining a segment of the electronic system that correspond to the current sensor for which the DC arc has been detected.

At block 622, method 600 may include triggering a switch corresponding to the source of the DC arc. This may include tripping a smart FET, fuse, relay, or other electronic or mechanical component, so as to avoid any further damage caused by the DC arc. In some examples this may include disconnecting a power circuit corresponding to one or more systems, such as a load associated with the DC arc.

In some examples, method 600 may further include determining a particular load that corresponds to the DC arc, which may be called a fault load. Where a plurality of smart FETs or other fuses are used, each corresponding to a respective load, some examples may include detecting a DC arc, determining a fault load, and enabling a central controller to control a smart FET that corresponds to the fault load. In this manner, the particular fault load may be removed from the high voltage electrical system so as to avoid causing damage to other components or systems. Method 600 may then end at block 624.

In this application, the use of the disjunctive is intended to include the conjunctive. The use of definite or indefinite articles is not intended to indicate cardinality. In particular, a reference to "the" object or "a" and "an" object is intended to denote also one of a possible plurality of such objects. Further, the conjunction "or" may be used to convey features that are simultaneously present instead of mutually exclusive alternatives. In other words, the conjunction "or" should be understood to include "and/or". The terms "includes," "including," and "include" are inclusive and have the same scope as "comprises," "comprising," and "comprise" respectively.

The above-described embodiments, and particularly any "preferred" embodiments, are possible examples of implementations and merely set forth for a clear understanding of the principles of the invention. Many variations and modifications may be made to the above-described embodiment(s) without substantially departing from the spirit and principles of the techniques described herein. All modifications are intended to be included herein within the scope of this disclosure and protected by the following claims.

What is claimed is:

1. A vehicle comprising:
   a high voltage electronic system comprising:
      a current sensor configured to capture current data; and
      a processor configured to:
         generate filtered data by applying a filter to the current data;
         determine a Hurst exponent based on the filtered data; and
         responsive to determining a threshold change in the Hurst exponent, detect the presence of a DC arc in the high voltage electronic system.

2. The vehicle of claim 1, wherein applying the filter to the current data comprises:
   applying a bandpass filter to the data to remove a DC component and a lower frequency range of the data; and
   applying an envelope filter to remove one or more periodic components of the data.

3. The vehicle of claim 1, wherein the processor is further configured to determine a rolling average Hurst exponent, and wherein the threshold change in the Hurst exponent is a threshold change in a magnitude of the rolling average Hurst exponent.

4. The vehicle of claim 1, wherein detecting the threshold change in the Hurst exponent comprises determining that the Hurst exponent has changed by a threshold amount for a threshold period of time.

5. The vehicle of claim 1, wherein the processor is further configured to exclude a change in a load of the high voltage electronic system as a source of the change in the Hurst exponent.

6. The vehicle of claim 1, wherein the processor is further configured to:
   determine a load corresponding to the DC arc; and
   responsive to detecting the presence of the DC arc, disconnect a power circuit corresponding to the load.

7. The vehicle of claim 1, further comprising:
   a plurality of current sensors, each configured to capture current data corresponding to a respective load of the high voltage electronic system;
   wherein the processor is further configured to:
      determine a plurality of Hurst exponents corresponding to the current data from the plurality of current sensors; and
      based on the plurality of Hurst exponents, determine a fault load corresponding to a detected DC arc in the high voltage electronic system.

8. The vehicle of claim 7, wherein the high voltage electronic system further comprises:
   a plurality of smart FETs, each corresponding to a respective load; and
   a central power controller configured to control a smart FET corresponding to the fault load based on the detected DC arc in the high voltage electronic system.

9. A method comprising:
   capturing current data using a current sensor of a high voltage vehicle electronic system;
   generating filtered data by applying a filter to the current data;
   determining a Hurst exponent based on the filtered data; and
   responsive to determining a threshold change in the Hurst exponent, detecting the presence of a DC arc in the high voltage electronic system.

10. The method of claim 9, wherein applying the filter to the current data comprises:
    applying a bandpass filter to the data to remove a DC component and a lower frequency range of the data; and
    applying an envelope filter to remove one or more periodic components of the data.

11. The method of claim 9, further comprising:
    determining a rolling average Hurst exponent, wherein the threshold change in the Hurst exponent is a threshold change in a magnitude of the rolling average Hurst exponent.

12. The method of claim 9, wherein detecting the threshold change in the Hurst exponent comprises determining that the Hurst exponent has changed by a threshold amount for a threshold period of time.

13. The method of claim 9, further comprising excluding a change in a load of the high voltage vehicle electronic system as a source of the change in the Hurst exponent.

14. The method of claim 9, further comprising:
    determining a load corresponding to the DC arc; and
    responsive to detecting the presence of the DC arc, disconnecting a power circuit corresponding to the load.

15. The method of claim 9, further comprising:
    capturing current data using a plurality of current sensors, each corresponding to a respective load of the high voltage vehicle electronic system;

determining a plurality of Hurst exponents corresponding to the current data from the plurality of current sensors; and based on the plurality of Hurst exponents, determining a fault load corresponding to a detected DC arc in the high voltage vehicle electronic system.

16. The method of claim 15, further comprising controlling a plurality of smart FETs each corresponding to a respective load of the high voltage vehicle electronic system; and activating a first smart FET corresponding to the fault load based on the detected DC arc in the high voltage vehicle electronic system.

* * * * *